United States Patent [19]
Berman et al.

[11] Patent Number: 6,091,934
[45] Date of Patent: Jul. 18, 2000

[54] DYNAMIC POWER ALLOCATION SYSTEM AND METHOD FOR MULTI-BEAM SATELLITE AMPLIFIERS

[75] Inventors: Arnold L. Berman, Los Angeles; William W. Mayfield, Torrance; Marvin R. Wachs, Calabasas, all of Calif.

[73] Assignee: Hughes Electronics Corporation, El Segundo, Calif.

[21] Appl. No.: 08/922,687

[22] Filed: Sep. 2, 1997

[51] Int. Cl.⁷ .................................................. H04B 7/185
[52] U.S. Cl. ......................... 455/13.4; 455/127; 455/103
[58] Field of Search .............................. 455/12.1, 13.1, 455/13.4, 16, 17, 23, 24, 114, 115, 116, 127, 427, 13.3, 103

[56] References Cited

U.S. PATENT DOCUMENTS

| | | | |
|---|---|---|---|
| 5,119,042 | 6/1992 | Crampton et al. | 330/295 |
| 5,550,550 | 8/1996 | Das | 455/13.3 |
| 5,826,170 | 10/1998 | Hirschfield et al. | 455/13.4 |

FOREIGN PATENT DOCUMENTS

| | | |
|---|---|---|
| 3-113545 | 11/1991 | Japan . |
| 4-53331 | 5/1992 | Japan . |

OTHER PUBLICATIONS

W. A. Sandrin, "The Butler matrix transponder", *Comsat Technical Review*, vol. 4, No. 2, Fall 1974, pp. 319–345.

*Primary Examiner*—Nguyen Vo
*Attorney, Agent, or Firm*—Terje Gudmestad; M. W. Sales

[57] ABSTRACT

The new signal amplifiers dynamically adjust based on the signal's power level. When used on multi-beam satellites, increased signal power indicates an increase in traffic on the channel. The power level of the input signal is sensed and converted to a DC signal, which is applied to a control terminal of a power supply that regulates DC power supplied to the amplifier. During periods of increased traffic, an increase in system power is allocated to the channel. By monitoring traffic on a plurality of channels, available onboard power is allocated based upon the relative channel requirements. The sensed power of multiple channels is summed and scaled to determine the power requirement of the channel relative to the other channels. A command voltage received from a ground station may be switched in place of the summed voltage to allow amplification levels to be controlled from the ground station.

6 Claims, 4 Drawing Sheets

DYNAMIC POWER ALLOCATION SYSTEM AND METHOD FOR MULTI-BEAM SATELLITE AMPLIFIERS

BACKGROUND OF THE INVENTION

1. Field of the Invention

This invention relates to multi-beam communications satellites, and more specifically to flexible dynamic allocation of power to high power amplifiers to meet varying traffic conditions while maintaining amplifier efficiency.

2. Description of the Related Art

Many modern satellite systems utilize multiple spot beams to allocate capacity to users located in different geographic regions. Examples of these systems range from Fixed Satellite Services (FSS) where a few large beams are used to distribute higher bandwidth data to Mobile Satellite Services (MSS) where, in the next generation systems, several hundred spot beams will be used to connect digital voice and low rate data between mobile and fixed users and local gateway stations with connections to the Public Switched Telephone Network (PSTN).

To ensure clear reception at the receiving stations, the satellite must amplify the uplink signals to provide a strong downlink signal. However, the available power on an orbiting satellite is limited by the amount of power generated by the satellite's solar panels. Known systems allocate a fixed amount of power to each channel. As a result, when traffic on the channel is light, power is wasted and when traffic is high the amplifiers saturate such that the amplification is insufficient to ensure clear reception.

Crampton, et al, U.S. Pat. No. 5,119,042, which is assigned to Hughes Aircraft Company, the assignee of the current application, discloses a method of dynamically adjusting each channel amplifier's operating point to maintain operation in the linear region without saturating. Crampton, et al, measures the power levels of the received uplink signal and the amplified output signal and adjusts the amplifier's operating point so that it operates in its linear region. The system does not monitor the power requirements of other channels. Nor does it allocate unused power from one channel to a channel with heavier signal traffic.

Another known power allocation system uses fixed solid state power amplifiers in a Butler Matrix configuration. The Butler Matrix configuration described in Sandrin, "The Butler Matrix Transponder", *COMSAT Technical Review*, Vol. 4, No. 2, Fall 1974, pages 320–321, uses two complementary Butler Martix networks. One precedes and the other follows a set of amplifiers. The networks distribute and collect each signal to and from each amplifier. This configuration offers a flexible power sharing by distributing the incoming signals among the amplifiers and redistributing the amplified signals to their respective outputs. Using the Butler Matrix configuration, optimum performance is achieved when the signal power of all channels is equal. This system does not, and is not intended to, allocate spare power to channels experiencing heavier traffic. Rather, Sandrin amplifies all input signals equally.

SUMMARY OF THE INVENTION

The present invention dynamically allocates power to the satellite's high power amplifiers to maintain amplifier efficiency and meet peak traffic demands and reduce power consumption during low traffic periods. This is accomplished by monitoring traffic on the channels and allocating available power based on the traffic.

In one embodiment, each channel senses the power level of the downlink signal prior to amplification. Power supplied to the amplifier tracks variations in the input signal to conserve power during low traffic periods and avoid saturating the amplifier during peak demands. In this embodiment, the satellite receives an uplink signal and converts it to a downlink signal. A detector senses the power level of the downlink signal which reflects the channel's traffic and uses the power level as a reference for a power supply to vary the supply voltage that is applied to the amplifier.

In another embodiment, traffic on multiple channels is monitored and the satellite's available power is allocated to each channel based on the channel's requirements relative to the other channels. Each channel's downlink signal power level is sensed, converted to a DC voltage and summed to produce a summed voltage. The summed voltage is scaled to each channel's respective DC voltage to determine the channels' power requirements relative to the other channels. Respective scaled voltages are used to vary the percentage of the satellite's available power that is allocated to respective amplifiers. Adjustable power supplies vary the supply voltage applied to the supply terminals of respective amplifiers in accordance with respective scaled voltages. To satisfy peak traffic requirements, the available onboard power is allocated to the channels based upon their relative requirements. This systems overcomes the disadvantage of known amplification systems by allocating unused power from one channel to a channel experiencing heavier traffic. It also avoids saturation during peak traffic periods by expanding the linear operating range of the amplifiers and reduces power consumption on channels with light traffic.

In yet another embodiment, the power level of the downlink signals transmitted from the satellite is controlled from a ground station. Commands are received from the ground station directing the power allocation system to use a command voltage level in place of the summed voltage produced onboard the satellite. This configuration is especially advantageous for time division matrix (TDM) systems which distribute input signals based on time slots. Since the TDM stream is generated at the ground station, the channel traffic is easily monitored prior to transmission. Commands transmitted with the TDM stream are used onboard the satellite to allocate increased power to channels with heavier traffic.

Using the dynamically adjustable amplification system, power, which is a valuable commodity on a satellite, is conserved by amplifying the downlink signal in accordance with the traffic on the channel.

These and further features and advantages of the invention will be apparent to those skilled in the art from the following detained description, taken together with the accompanying drawings, which are not to scale.

DETAILED DESCRIPTION OF THE INVENTION

The dynamically adjustable power allocation system adjusts the power supplied to the high power amplifier based on a traffic level to reduce power consumption and meet peak traffic demands. For multi-channel systems, traffic on multiple channels is monitored to allocate available system power between the channels. As traffic on a channel increases, a corresponding increase in power is allocated to that channel. In an alternative embodiment, power is controlled by commands generated and transmitted from a ground station.

Figure 1:
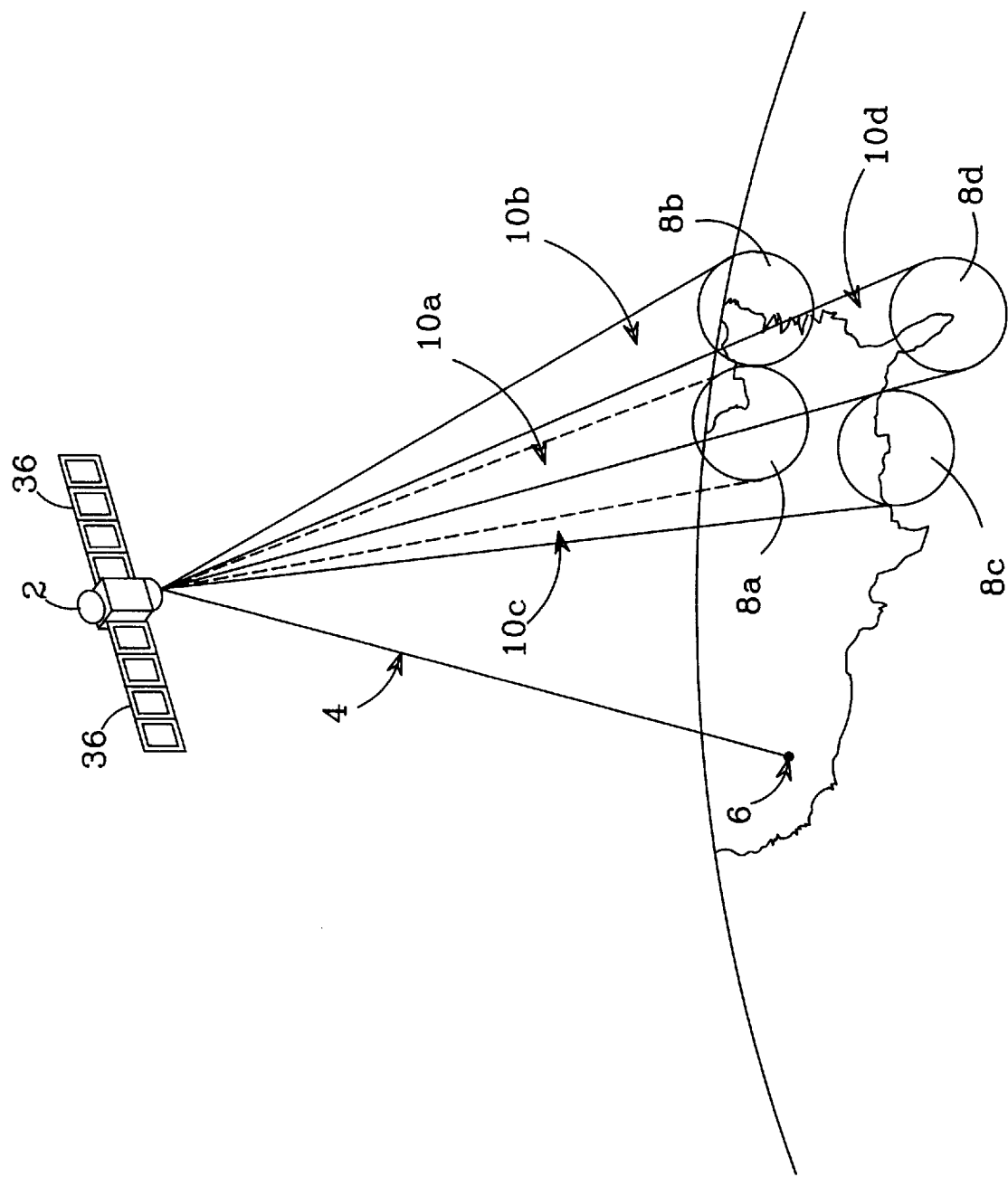
FIG. 1 is a representation of a multi-beam communications satellite with multiple spot beams broadcasting to users in different geographic regions.

As shown in FIG. 1, a multi-beam satellite 2 receives uplink signals 4 from a single ground station 6 and transmits them to four geographic regions 8a–8d in this example. Uplink signals for multiple transmit channels can be transmitted using frequency multiplexed carriers or time slots. To determine the channel destination for frequency multiplexed carriers, each channel receiver is tuned to respond to signals within a specific band. The frequency spectrum of the receive antenna includes the frequency bands of the channels fed by that antenna. The time division matrix (TDM) system uses bursts of signals within time slots. A time division matrix switch onboard the satellite transfers the received signal bursts to their correct destination based on the time slot it occupies. The dynamic power amplification systems is applicable to both types of carriers since an increase in channel traffic is reflected by increased input signal power levels.

The amount of information transmitted in individual downlink beams varies with the incoming traffic. In one approach, as illustrated in detail in FIGS. 2 and 3, the channels are adjusted independently such that the amplifier power tracks the uplink signal power in its channel only. In another approach, as illustrated in detail in FIG. 5, the amplifiers power tracks the uplink signals power in its channel relative to the other channels. To meet peak channel requirements, the available power is shifted from low to high traffic channels. For example, when the number of uplink signals 4 within the downlink bands of beams 10a and 10b are high and low, respectively, the additional power required to amplify the downlink signals transmitted in downlink beam 10a is shifted over from downlink beam 10b. This provides sufficient amplification resulting in transmission of signals that are strong and well received by the receiving stations while reducing system power consumption.

Figure 2:
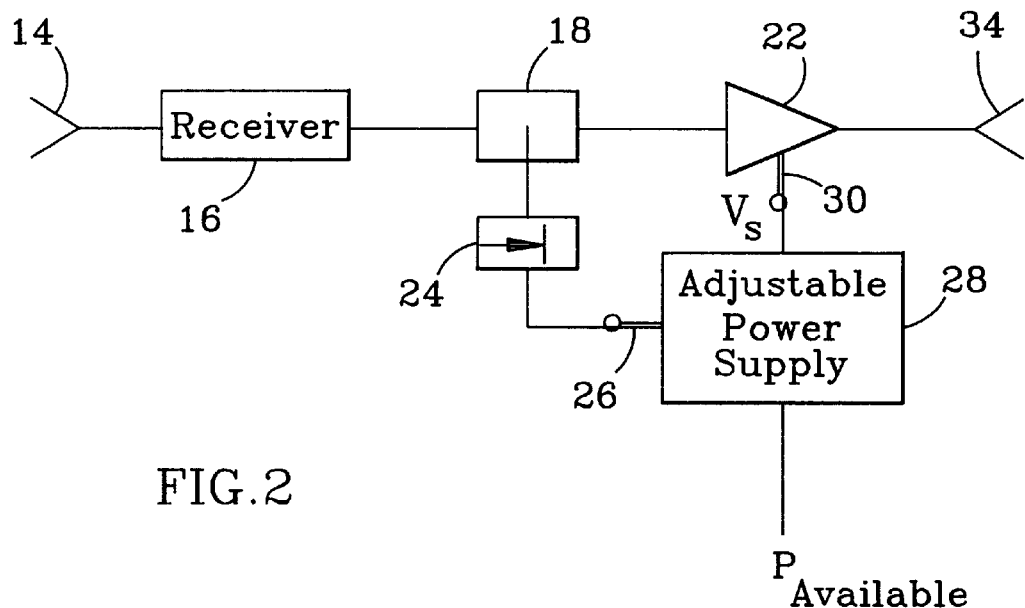
FIG. 2 is a schematic diagram of a single channel amplification system which dynamically adjusts the supply voltage applied to the amplifier.

FIG. 2 is a schematic diagram of a dynamically adjustable satellite amplification system 12 for a single channel of the multi-beam satellite of the type shown in FIG. 1. A receive antenna 14 receives an uplink signal and feeds it to a receiver 16 which filters the uplink signal and converts it to a respective downlink signal. A sampling device 18 such as a directional coupler or T-junction, samples the downlink signal prior to amplification by a high power amplifier 22. A detector 24, such as a diode or crystal detector, senses and converts the sampled signal to a corresponding DC voltage level, which provides a reference voltage. A power supply 28 regulates the amount of power supplied to amplifier 22 by varying the supply voltage $V_s$ applied at its supply terminal 30 in accordance with the reference voltage. Power amplifier 22 should be designed to maintain its efficiency over a range of drain voltages and output power. A solid state power amplifier with dynamically adjusted operating points is described by Crampton, et al, in U.S. Pat. No. 5,119,042. Although the amplification system has been described using a coupler to sample the downlink signal, a detector connected between the receiver 16 and the amplifier 22 could detect the downlink signal voltage level directly.

Figure 3:
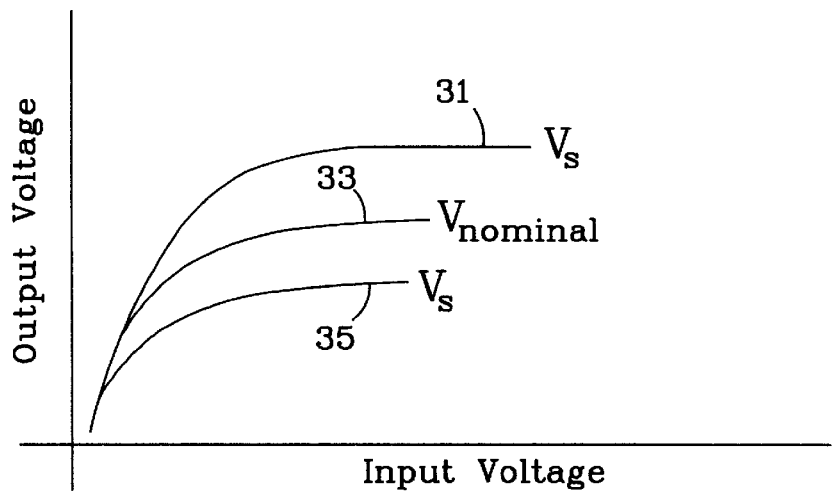
FIG. 3 is a graph of an amplifier's linear operating range in accordance with the invention.

As traffic on the channel changes, the new amplification system dynamically adjusts the supply voltage applied to the supply terminal 30 of power amplifier 22. FIG. 3 illustrates the linear operating range of high power amplifier 22. The operating point of the amplifier 22 is changed by varying the supply voltage $V_s$ applied to the amplifier 22. Curve 33 illustrates the linear operating range for a nominal supply voltage $V_s$ and curve 31 illustrates the expanded operating range of amplifier 22 when an increased supply voltage $V_s$ is applied to amplifier 22 to avoid saturation during peak traffic periods. Similarly, during periods of low traffic, power consumption is reduced by operating amplifier 22 at a lower supply voltage as shown by curve 35. As illustrated in FIG. 3, the gain of the amplifier is maintained while its operating points are changed to track variations in the channels traffic.

Figure 4:
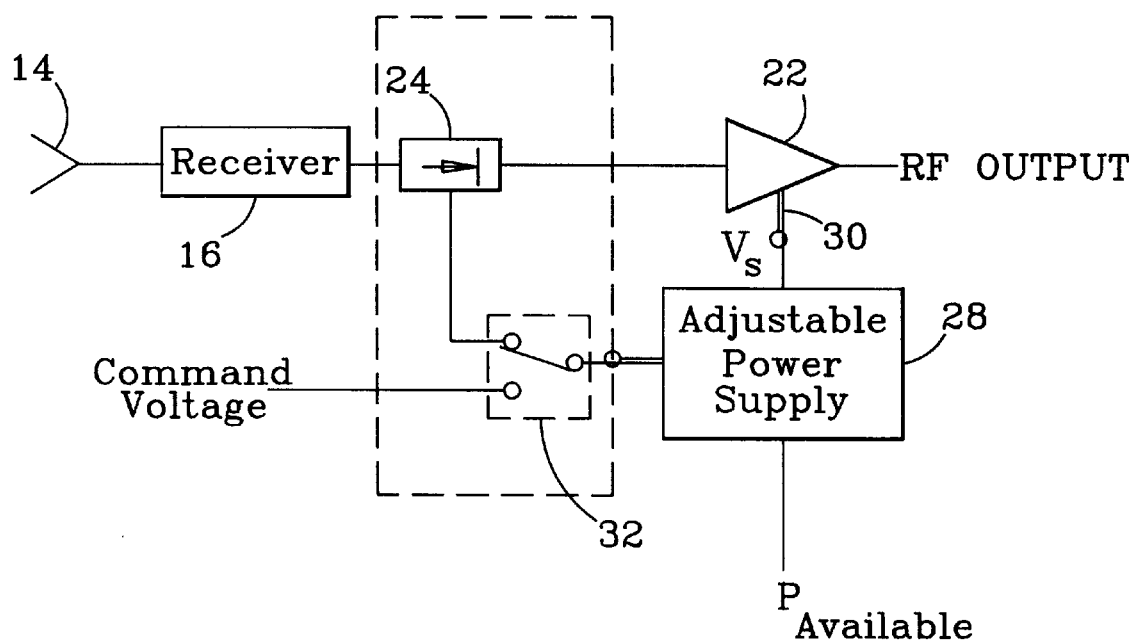
FIG. 4 is a schematic diagram of a dynamically adjustable power amplifier with selectable operator control.

As shown in FIG. 4, the system can be modified to respond to either the sensed power level onboard the satellite or a reference voltage provided by a ground station that monitors traffic transmitted to a satellite. The ground station selectively transmits commands to the satellite directing it to amplify the downlink signals according to the transmitted command voltage. When such commands are received, a switch 32 switches the command voltage to the power supply 28. Otherwise, the signal voltage level sensed onboard the satellite is passed to the power supply 28.

The new dynamically adjustable amplification system is especially advantageous when monitoring traffic on a plurality of channels. By monitoring a plurality of channels, power can be allocated to channels experiencing heavier traffic while reducing the power amplification of channels with lighter traffic. Using this system, increased power is available to the channels without increasing the overall system power requirements. In effect, the additional power required by one channel during periods of increased traffic is borrowed from a channel with light traffic.

Figure 5:
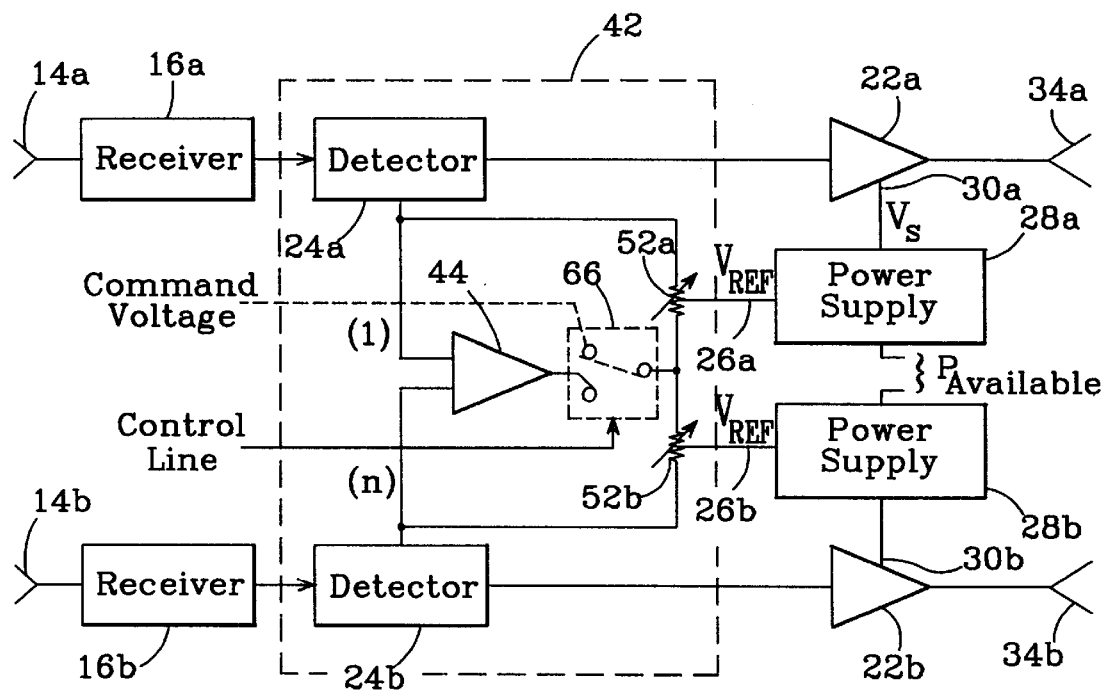
FIG. 5 is a schematic diagram of a dynamically adjustable power allocation system that monitors a plurality of channels and adjusts the supply voltages applied to respective amplifiers.
Figure 6:
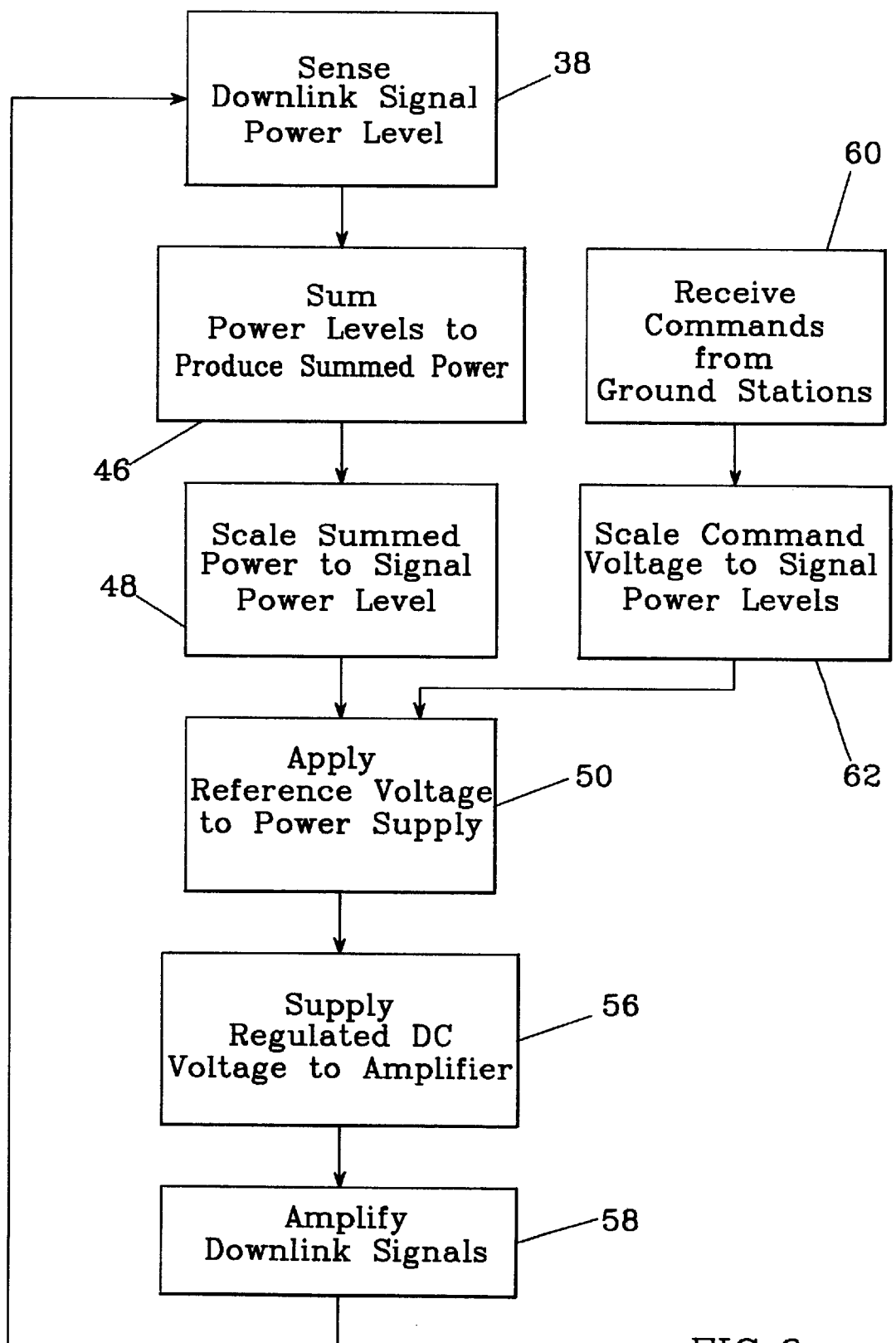
FIG. 6 is a flow diagram of a method of dynamically adjusting supply voltages applied to amplifiers in accordance with the invention.

As shown in FIGS. 5 and 6, satellite receive antennas 14a and 14b receive uplink signals and receivers 16a and 16b convert them to respective downlink signals for amplification and broadcast from transmit antennas 34a and 34b. Solar panels (36 in FIG. 1) supply power to the satellite, a portion of which is available for amplification of downlink signals. Prior to amplification, detectors 24a and 24b sense the power levels of their respective channel's downlink signal and convert it to a DC voltage (step 38 in FIG. 6). A controller 42 allocates the available amplification power to the amplifiers based on relative traffic levels on the channels. In this example, the controller 42 includes a summing or integrating circuit 44 that sums the DC voltage to produce a summed voltage of the monitored channels (step 46 in FIG. 6). Each channel's DC voltage is scaled by the summed voltage (step 48 in FIG. 6) to determine the percentage of the available power allocated to that channel. The scaled voltages are used as reference voltages to determine the DC supply voltage applied (step 50) to the supply terminals 30a and 30b of respective amplifiers 22a and 22b. In this example, scaling is accomplished by applying summed voltage to one terminal of a variable resister 52a and 52b while the sensed DC voltage is applied to the other. The voltage drop across resistors 52a and 52b is the difference between the sensed and summed voltages, or a scaled voltage. The scaled reference voltage applied to the control terminals 26a and 26b of power supplies 28a and 28b (step 50 in FIG. 6) reflects the power requirement for their respective channels based on their respective traffic. Each channel's amplifier 22a and 22b receives a supply voltage $V_s$ supplied by respective power supplies 28a and 28b (steps 56 and 58 in FIG. 6) which reflects their power requirement relative to the power requirements of the other channels. As the traffic levels of the channels vary, so does the power allocation among the channels. Lowering the power allocation to one amplifier effectively makes more power available to amplifiers which require increased power due to increased traffic on that channel.

The traffic, and therefore the power requirements, of the channels can be monitored and controlled from a ground station. Commands received from the ground station (step 60 in FIG. 6) direct the system to use the received reference voltage in the place of the summed voltage to produce the scaled reference voltages (step 62 in FIG. 6) which are applied to the control terminals 26a and 26b of the power supplies 28a and 28b (step 50 in FIG. 6). A switch 66, shown in FIG. 4, is used to apply either the summed or reference voltage to the scaling device. The switch 66 position is controlled by commands received from the ground station. This alternative embodiment is particularly suited for satellites utilizing a time division matrix. A matrix distributes information within each time slot to its corresponding channel for amplification and broadcast. Because the stream is transmitted from a single ground station, the traffic can be easily monitored. Commands corresponding to the total traffic are transmitted with the stream directing the new amplification system to vary the supply voltage on multiple channels in accordance with commands in the stream.

An advantage of using a dynamically adjustable power allocation system is that it allocates power to each channel relative to the traffic on that channel and the requirements of other channels. The new system also provides a method of controlling the power allocation from the ground to allow limited satellite power to be efficiently shifted from channels with light traffic to channels with heavy traffic. Allocating power to channels experiencing heavy traffic results in improved reception of the downlink signals at the ground stations and reduces power consumption during periods of light traffic.

Although the dynamic power allocation system has been described using a solid state amplifier, it is applicable to other amplification devices such as traveling wave tube (TWT) amplifiers. However, to implement this system for TWT amplifiers, the TWT amplifier requires an additional control anode to adjust the cathode current. Alternative embodiments will occur to those skilled in the art. Such variations and alternatives are contemplated, and can be made without departing from the spirit and scope of the invention defined in the appended claims.

We claim:

1. A power allocation system for supporting the amplification of received signals in a satellite, comprising:
   a plurality of amplifiers for amplifying respective ones of said received signals,
   a plurality of power supplies that each supply power to a respective one of said amplifiers wherein said power supplies share an available power, and
   a controller that allocates said available power to said power supplies based on the relative power levels of the received signals of their respective amplifiers;
   wherein said controller includes:
      a plurality of detectors that sense said power levels and produce respective signals,
      a summing device that sums said respective signals to produce a summed signal, and
      a scaling device that scales said summed signal with said respective signals to produce respective scaled signals that are applied to respective power supplies.

2. The power allocation system of claim 1, wherein said power supplies apply respective voltages to respective amplifiers and said respective voltages are in accordance with said respective scaled signals.

3. The power allocation system of claim 1, wherein said scaling device includes a plurality of variable resistors that form said respective scaled signals in response to said detectors and said summing device.

4. A method of allocating available power in a satellite for amplification of received signals, comprising the steps of:
   sensing respective power levels of said received signals, and
   allocating said available power for amplification of each of said received signals based on the respective power level of that received signal relative to the respective power levels of others of said received signals;
   wherein said allocating step includes the steps of:
      summing said respective power levels to produce a summed signal,
      scaling said summed signal with said respective power levels to produce respective scaled signals, and
      allocating said available power based on said respective scaled signals.

5. The method of claim 4, wherein said scaling step includes the step of coupling said respective power levels to respective variable resistors which are also coupled to said summed signal.

6. The method of claim 4, wherein said allocating step includes the steps of:
   determining respective voltages in accordance with said respective scaled signals; and
   applying said respective voltages to respective amplifiers that perform said amplification.

* * * * *